United States Patent
Morii et al.

(10) Patent No.: US 7,488,054 B2
(45) Date of Patent: Feb. 10, 2009

(54) FILM FORMING DEVICE, FILM FORMING METHOD, AND METHOD FOR MANUFACTURING ELECTRONIC APPLIANCE

(75) Inventors: Katsuyuki Morii, Lausanne (CH); Kenji Sakamoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 461 days.

(21) Appl. No.: 11/335,460

(22) Filed: Jan. 20, 2006

(65) Prior Publication Data

US 2006/0192814 A1 Aug. 31, 2006

(30) Foreign Application Priority Data

Feb. 28, 2005 (JP) ............................. 2005-054821

(51) Int. Cl.
*B41J 2/135* (2006.01)
(52) U.S. Cl. ........................................................ 347/44
(58) Field of Classification Search .................. 347/44, 347/45
See application file for complete search history.

(56) References Cited

U.S. PATENT DOCUMENTS 6,672,702 B2 * 1/2004 Sadasivan et al. ............. 347/19

FOREIGN PATENT DOCUMENTS

| JP | A 11-40358 | 2/1999 |
|---|---|---|
| JP | A 11-54272 | 2/1999 |

\* cited by examiner

*Primary Examiner*—An H Do
(74) *Attorney, Agent, or Firm*—Oliff & Berridge, PLC

(57) ABSTRACT

A film forming device includes: a first discharge unit for discharging a first liquid material, in which a film forming material is dissolved in a solvent or dispersed in a dispersion medium; a second discharge unit for discharging a second liquid material containing a liquid with the same component as the solvent or the dispersion medium; and a removal unit for removing the solvent or the dispersion medium from droplets of the first liquid material arranged on a substrate by the first discharge unit, while removing the liquid, arranged on the substrate by the second discharge unit, from droplets of the second liquid material; wherein a film is formed on the substrate, by arranging the droplets of the first liquid material on first parts on the substrate by the first discharge unit, while arranging the droplets of the second liquid material on second parts on the substrate, which are separated from the first parts, by the second discharge unit, thereafter by removing the solvent from the droplets of the first liquid material arranged on the first parts, using the removal unit for solvent removing.

18 Claims, 9 Drawing Sheets

FILM FORMING DEVICE, FILM FORMING METHOD, AND METHOD FOR MANUFACTURING ELECTRONIC APPLIANCE

BACKGROUND

1. Technical Field

The present invention relates to a film forming device, a film forming method, and a method for manufacturing an electronic appliance.

2. Related Art

It is known that there are methods for forming films composed with high polymer compounds, such as arranging a solution, in which the high polymer compounds are dissolved in a solvent, utilizing an inkjet method on a substrate, thereafter causing the solvent to evaporate from the arranged solution. It is relatively easy to produce films with high polymer compounds.

In contrast, if the same method described above, which applies to high polymer compounds, is used for compounds with a low molecular weight (hereafter referred to as 'low-molecular compounds') that are not categorized as high polymer compounds, the low-molecular compounds film is not formed, and the particles thereof are separated out on the substrate. This is caused since the cohesive force between the low-molecular compounds is significantly larger than the bonding power between the low-molecular compound and the substrate.

The low-molecular compounds are materials with a high crystallizability, as their cohesive force is strong, which carries a great advantage in functionalities such as conductivity. Therefore, a method that allows film formation of low-molecular compounds is awaited.

When droplets are arranged on substrates by discharging solvents with the inkjet method, the uneven partial pressure of gas in the vicinity of the droplets causes a distortion of the droplets. Consequently, the droplets tend to shift toward the locations with a higher partial pressure. Here, the gas includes the same component as that of a solvent of the solution in the droplets. This shifting of droplets tends to occur particularly when discharging a solution with low-molecular compounds, in which their bonding with the substrate is weak, resulting in difficulties in forming the film on the prescribed location on the substrate.

For instance, if several droplets are formed with very small intervals along a line, the partial pressure in the vicinity of the droplets formed in the outermost edge of the line is lower in the outer side where there are no droplets, and higher in the inner side where there are other droplets, resulting in an uneven partial pressure. This is caused since the solvent vapor originating from the adjacent droplet increases the partial pressure of the gas in the side where there are other droplets in the vicinity of the last droplet in line.

In many electronic devices, functional films are used after undergoing patterning. Constraints in the employed material or specific conditions are required when forming organic crystalline films with a vacuum deposition and the like. The resist tolerance of the organic films is low. Therefore, applying normal patterning with photolithography and etching is difficult.

In contrast, if the crystalline films are formed with the inkjet method, then the formation of the patterned organic crystalline films become easier.

JP-A-11-40358 and JP-A-11-54272 are examples of related art.

SUMMARY

An advantage of the present invention is to provide a film forming device, a film forming method, and a method for manufacturing an electronic appliance, in which a crystalline film is formed at the desired location even when using a low-molecular compound as a film forming material.

The advantage of the invention is achieved by the following aspects of the invention.

According to a first aspect of the invention, a film forming device includes: a first discharge unit for discharging a first liquid material, in which a film forming material is dissolved in a solvent or dispersed in a dispersion medium; a second discharge unit for discharging a second liquid material containing a liquid with the same component as the solvent or the dispersion medium; and a removal unit for removing the solvent or the dispersion medium from droplets of the first liquid material arranged on a substrate by the first discharge unit, while removing the liquid, arranged on the substrate by the second discharge unit, from droplets of the second liquid material; wherein a film is formed on the substrate, by arranging the droplets of the first liquid material on first parts on the substrate by the first discharge unit, while arranging the droplets of the second liquid material on second parts on the substrate, which are separated from the first parts, by the second discharge unit, thereafter by removing the solvent from the droplets of the first liquid material arranged on the first parts, using the removal unit for solvent removing.

This allows a control of speed in removing the solvent or the dispersion medium from the droplet of the first liquid material on the substrate, and a formation of a small-numbered crystal core (preferably one) in the droplet. Thereafter, by rapidly removing the solvent or the dispersion medium from the droplet, the crystal core grows and the crystalline film is formed on the substrate.

Particularly, according to this aspect of the invention, by appropriately depositing, on the substrate, the second liquid material that includes the same component as, or one similar to, that of the solvent or the dispersion medium, the equalization of the partial pressure of gas in the vicinity of droplets of the first liquid material on the substrate, where the gas includes the same component as, or one similar to, that of the solvent or the dispersion medium, is achieved. As a result, the unnecessary shift of droplets of the first liquid material on the substrate is prevented, and the crystalline film is formed at the desired location on the substrate.

It is preferable that, in the film forming device, the second parts be in the vicinity of the first parts.

This results in an equalization of the partial pressure of gas in the vicinity of droplets of the first liquid material on the substrate, where the gas includes the same component as, or one similar to, that of the solvent or the dispersion medium, in a high degree of certainty.

It is preferable that, in the film forming device, the second liquid material be composed only from a liquid containing the same component as the solvent or the dispersion medium.

This results in an equalization of the partial pressure of gas in the vicinity of droplets of the first liquid material on the substrate, where the gas includes the same component as, or one similar to, that of the solvent or the dispersion medium, in a high degree of certainty.

It is preferable that, in the film forming device, the first liquid material, discharged by the first discharge unit, contain the film forming material in a volume of which the concentration level is equal to or higher than one-tenth of the saturation concentration of the film forming material.

Consequently, the droplets of the first liquid material tend to become supersaturated immediately after they are deposited onto the substrate, thereby causing the crystal core to be formed in the droplet of the first liquid material in a higher degree of certainty.

It is preferable that, in the film forming device, the first and the second discharge units each have inkjet heads.

As a result, distance between the droplet of the first liquid material and the droplet for the second liquid material can be relatively easily configured by the arrangement of inkjet heads.

It is preferable that, in the film forming device, the inkjet heads of the first discharge unit and the inkjet heads of the second discharge unit be allowed to shift relative to the substrate in the direction parallel to the surface thereof.

Consequently, locations and numbers thereof for forming the droplets for the first and the second liquid materials is modified accordingly.

It is preferable that, in the film forming device, the first discharge unit be configured to arrange the droplets of the first liquid material on the first parts, after the droplets of the second liquid material is arranged on the second parts by the second discharge unit.

With this configuration, the gas with the same or similar component as that of the solvent is formed in advance, and thereafter the droplet of the first liquid material is deposited to the substrate. Hence the time it takes to remove the solvent from the droplet of the first liquid material on the substrate is controlled with a higher degree of certainty.

Here, it is preferable that there be the plurality of first parts, and that the second part be located in between the first parts.

This results in an equalization of the partial pressure of gas in the vicinity of droplets of the first liquid material on the substrate, among the droplets of the first liquid material, where the gas includes the same component as, or one similar to, that of the solvent.

It is preferable that, the film forming device further include a controller for controlling a drive of the first and the second discharge units, based on drive information of the first discharge unit.

This allows the droplets for the first and the second liquid materials to be formed at the desired locations.

It is preferable that, in the film forming device, the controller control quantities and/or locations of the first liquid material discharged from the first discharge unit, and of the second liquid material discharged from the second discharge unit.

This allows the droplets for the first and the second liquid materials to be formed at the desired locations, while preventing any contact between them.

It is preferable that, the film forming device further include a stage for holding the substrate, where the first and the second discharge units are each driven in a state in which the substrate is held to the stage.

Hence the droplets formed on the substrate become stable.

It is preferable that, in the film forming device, the stage include a body and a supporting material that are installed detachable to the body and supports the substrate.

This allows an easy carriage of the substrate after the deposition of the droplets to another location from the stage.

It is preferable that, in the film forming device, there be an option to install a cover on the supporting material in order to maintain a gas in the vicinity of the droplets of the first and the second liquid materials on the substrate that is supported by the supporting material.

This allows a carriage of the substrate to another location from the stage, while keeping the gas in the vicinity of the droplets on the substrate.

In this case, it is preferable that a forced solvent remover be provided, in which the solvent removal unit removes the solvent or the dispersion medium from the droplets of the first liquid material on the substrate faster, after the first and the second discharge units deposit the droplets on the substrate.

Consequently, the crystal core formed in the droplet of the first liquid material on the substrate can have crystal growth, with a higher degree of certainty.

In this case, it is preferable that the forced solvent remover includes a heater for applying heat to the droplets of the first liquid material on the substrate.

Consequently, with a relatively simple device structure, the crystal core formed in the droplet of the first liquid material on the substrate can have crystal growth, with a higher degree of certainty.

Moreover, it is preferable that the forced solvent remover include a depressurization means for gas pressure reduction in the vicinity of the droplets of the first liquid material on the substrate.

As a result, with a relatively simple device structure, the crystal core formed in the droplet of the first liquid material on the substrate can have crystal growth with a higher degree of certainty.

It is preferable that, in the film forming device, orifices of the first and the second discharge units be installed outside the reduced pressure area.

This allows the simplification of the device structure while preventing the leak of the first and the second liquid materials caused by, for instance, the exposure of the inkjet head in the reduced pressure.

According to a second aspect of the invention, a method of film forming includes: a process for arranging, on first parts on a substrate, by a first discharge unit, droplets of a first liquid material, in which a film forming material is dissolved in a solvent or dispersed in a dispersion medium; a process for arranging, by a second discharge unit, droplets of a second liquid material containing a liquid with the same component as the solvent or the dispersion medium, on second parts on a substrate, which are separated from the first parts; and a process for removing, in a removal unit, the solvent or the dispersion medium from droplets of the first liquid material arranged on the substrate by the first discharge unit, while removing the liquid from droplets of the second liquid material arranged on the substrate by the second discharge unit, thereby forming a film on the substrate.

As a result, in the case of using a low molecular compound as a film forming material, a film forming method, which allows a formation of a crystalline film at the desired location, can be provided.

It is preferable that, in the method of film forming, the second parts be in the vicinity of the first parts.

This results in an equalization of the partial pressure of gas in the vicinity of droplets of the first liquid material on the substrate, where the gas includes the same component as, or one similar to, that of the solvent or the dispersion medium, in a high degree of certainty.

It is preferable that, in the method of film forming, the second liquid material be composed only from a liquid, containing the same component as the solvent or the dispersion medium.

This results in a equalization of the partial pressure of gas in the vicinity of droplets of the first liquid material on the substrate, where the gas includes the same component as, or one similar to, that of the solvent or the dispersion medium, in a high degree of certainty.

It is preferable that, in the method of film forming, there be a plurality of first parts, and the second parts be located in between the first parts.

This results in an equalization of the partial pressure of gas in the vicinity of droplets of the first liquid material on the substrate, among the droplets of the first liquid material, where the gas includes the same component as, or one similar to, that of the solvent.

According to a third aspect of the invention, a method for manufacturing an electronic appliance uses the film forming method according to the first aspect of the invention.

As a result, the method for manufacturing an electronic appliance, in which a crystalline film is formed at the desired location even in the case of using a low molecular compound as a film forming material, can be provided.

It is preferable that, in this case, an electronic appliance be an organic electroluminescence device.

Consequently, an organic electroluminescence display device with excellent characteristics of conductivity, and with an accurate pattern in a desired location, can be achieved.

BRIEF DESCRIPTION OF THE DRAWINGS

The invention will be described with reference to the accompanying drawings, wherein like numbers reference like elements.

DESCRIPTION OF EXEMPLARY EMBODIMENTS

The film forming device according to the suitable embodiment of the present invention shown in the attached illustrations will now be described in detail.

Figure 1:
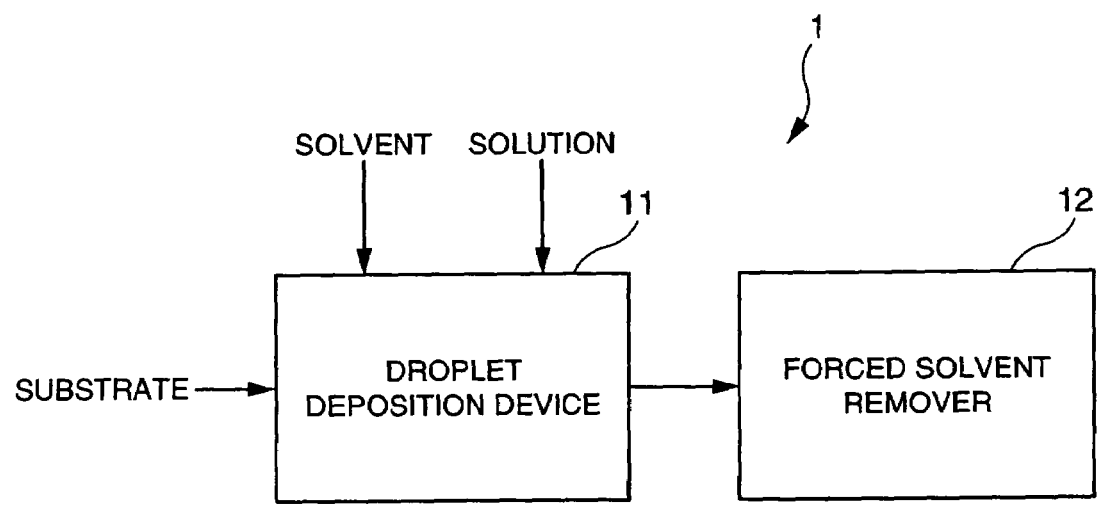
FIG. 1 is a drawing showing a schematic structure of a film forming device according to the embodiment of the invention.
Figure 2:
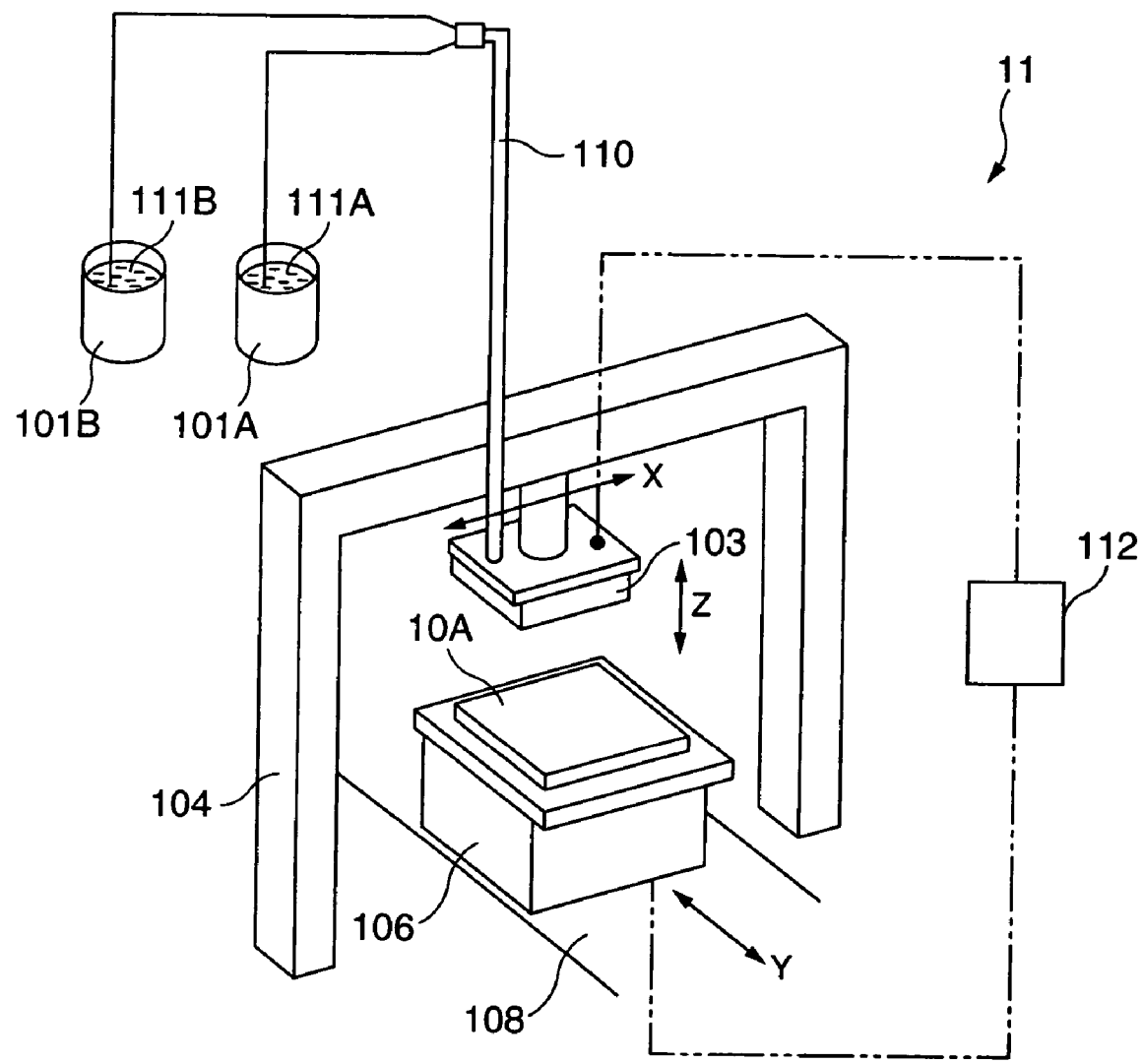
FIG. 2 is a drawing showing a schematic structure of a droplet deposition device in the film forming device shown in FIG. 1.
Figure 3:
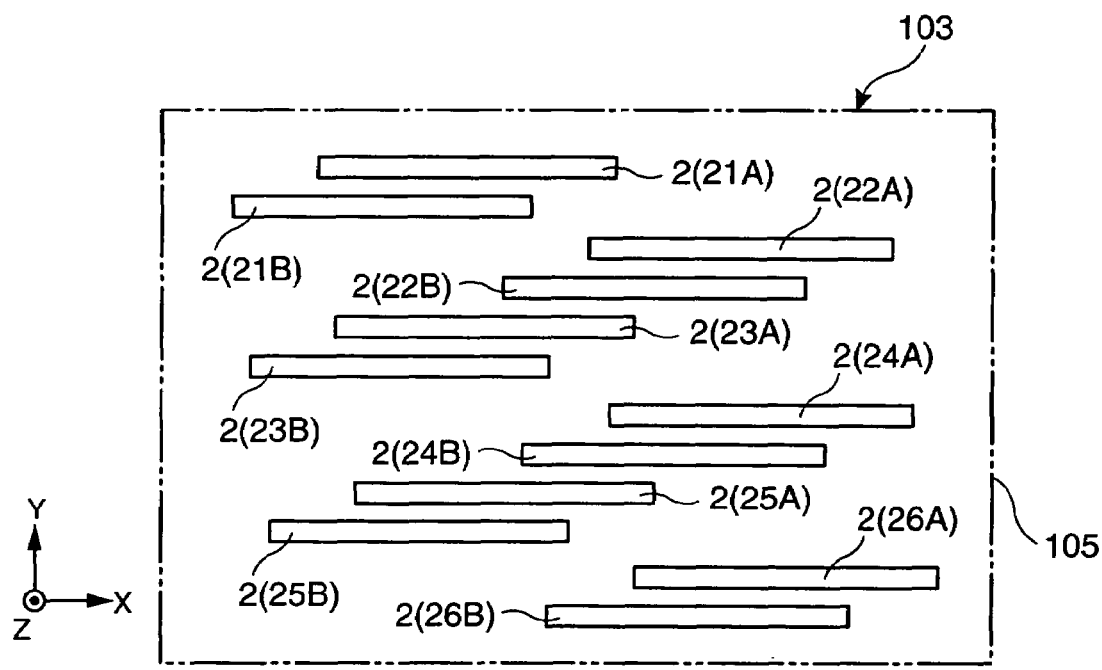
FIG. 3 is a drawing showing a droplet discharge unit in the droplet deposition device shown in FIG. 2.
Figure 4A:
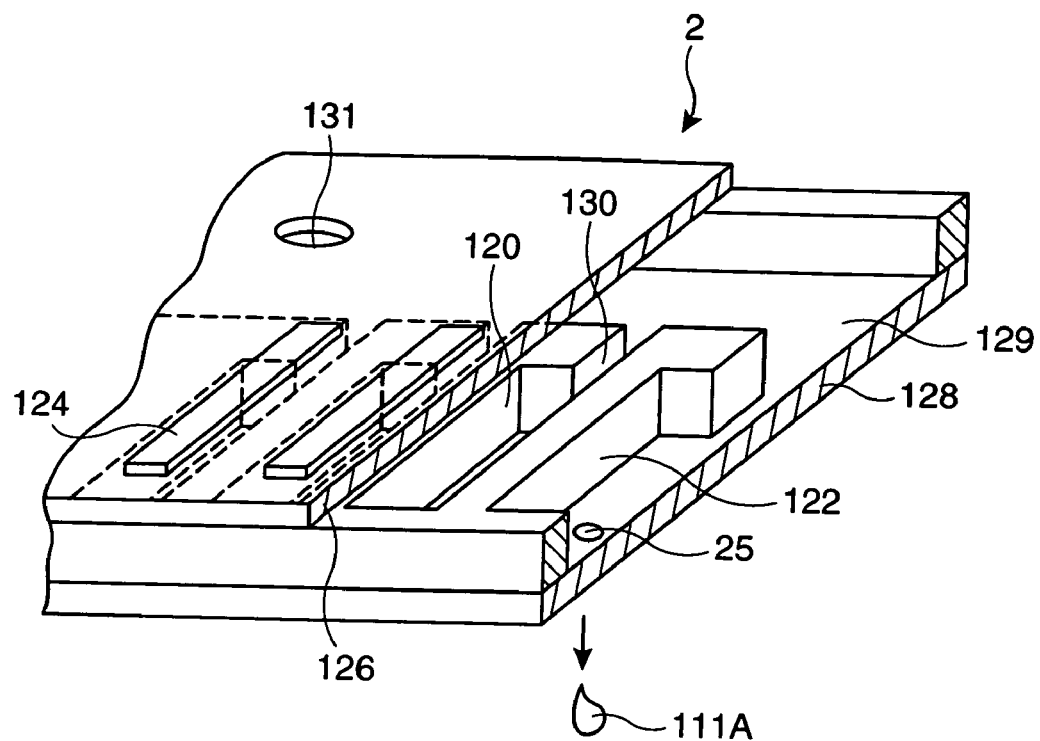
FIGS. 4A and 4B are drawings showing a droplet discharge head in the droplet discharge unit shown in FIG. 3.
Figure 4B:
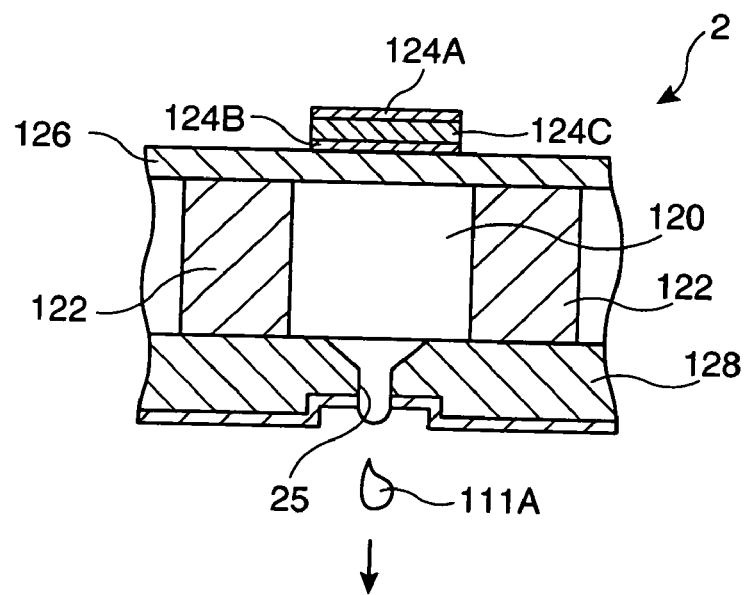
Figure 5:
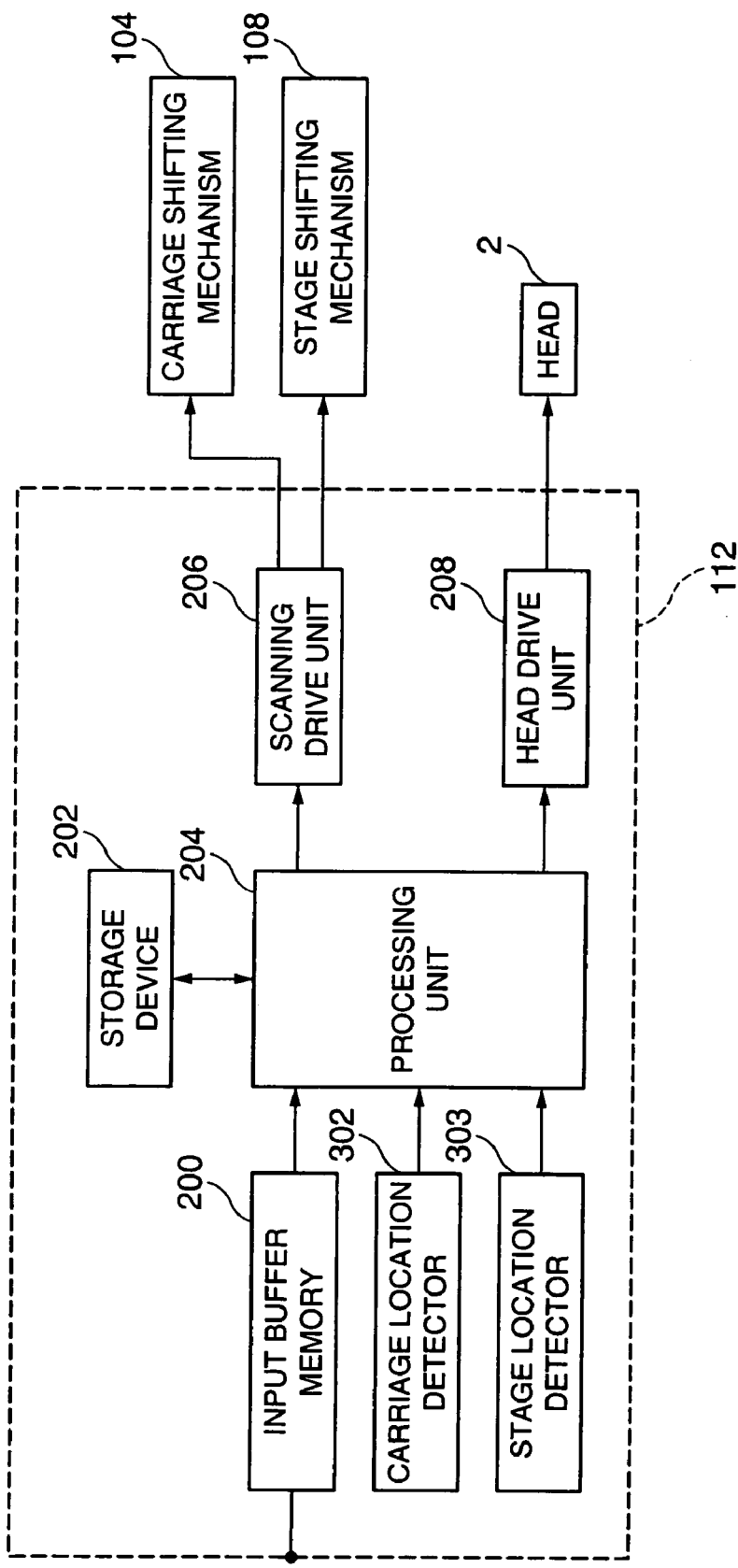
FIG. 5 is a block diagram showing a control system of the droplet deposition device shown in FIG. 2.
Figure 6A:
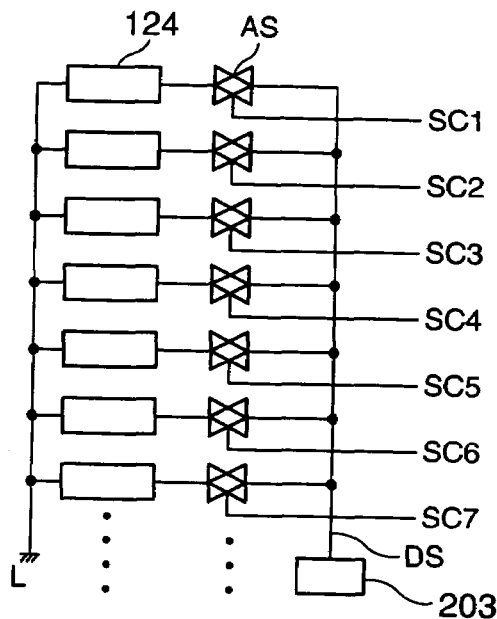
FIGS. 6A and 6B are timing charts describing the operation of the droplet discharge head in the droplet deposition device shown in FIG. 2.
Figure 6B:
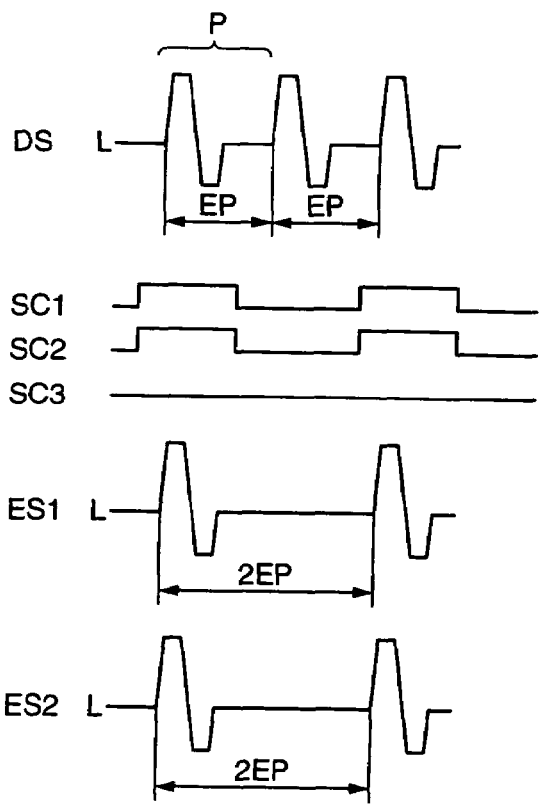
Figure 7:
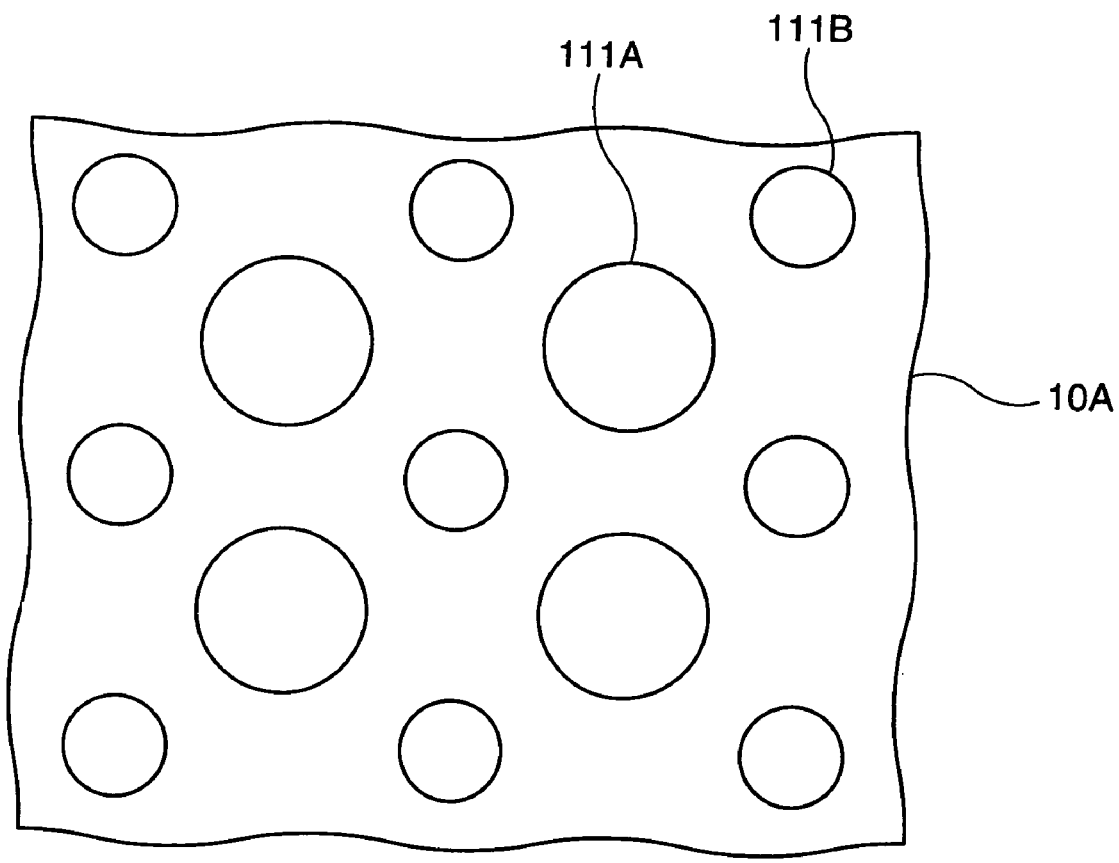
FIG. 7 is a drawing showing the status of a substrate, on which droplets are deposited by the droplet deposition device shown in FIG. 2.
Figure 8:
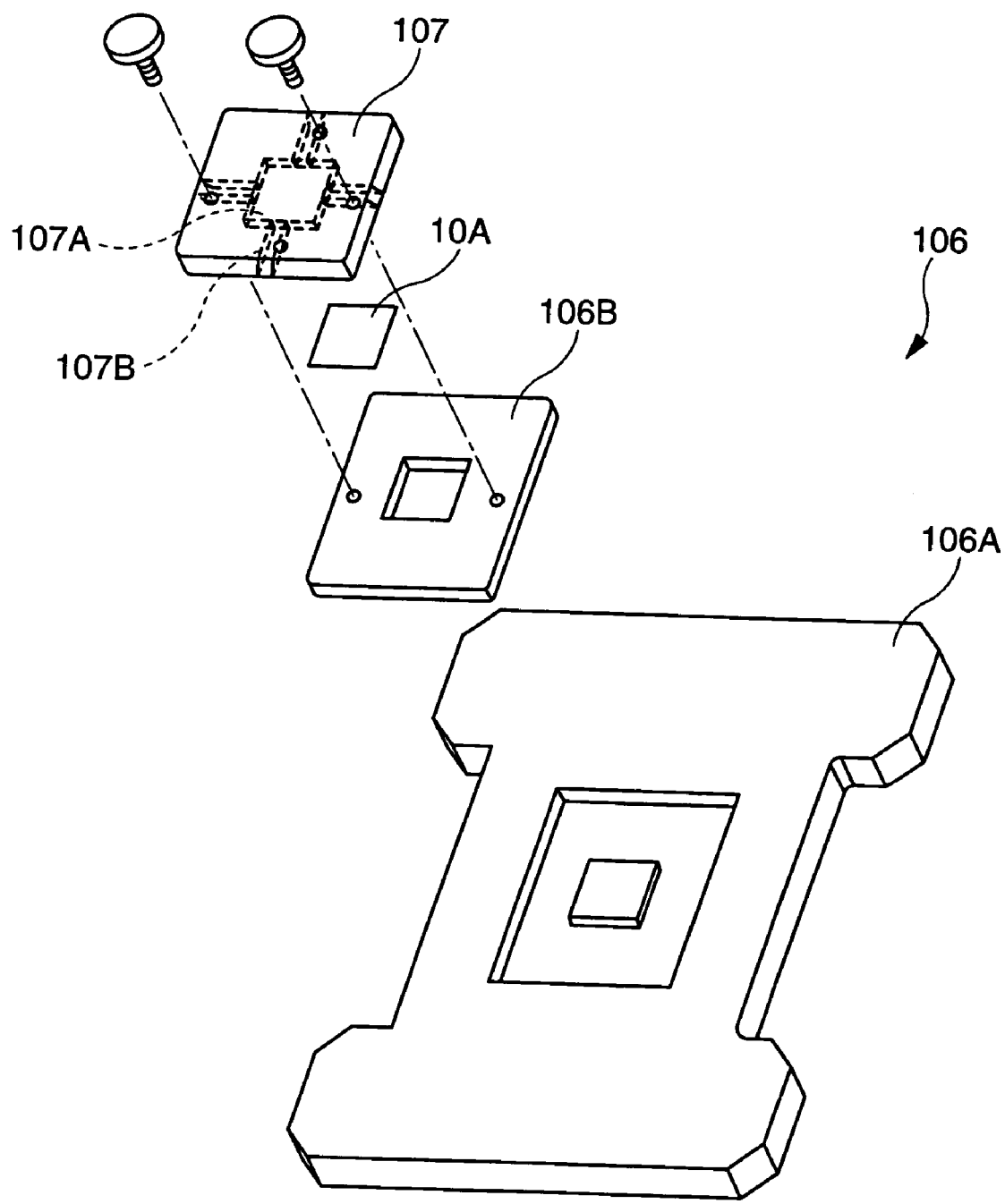
FIG. 8 is a drawing for explaining a mechanism that prevents a spontaneous drying of droplets on the substrate.
Figure 9:
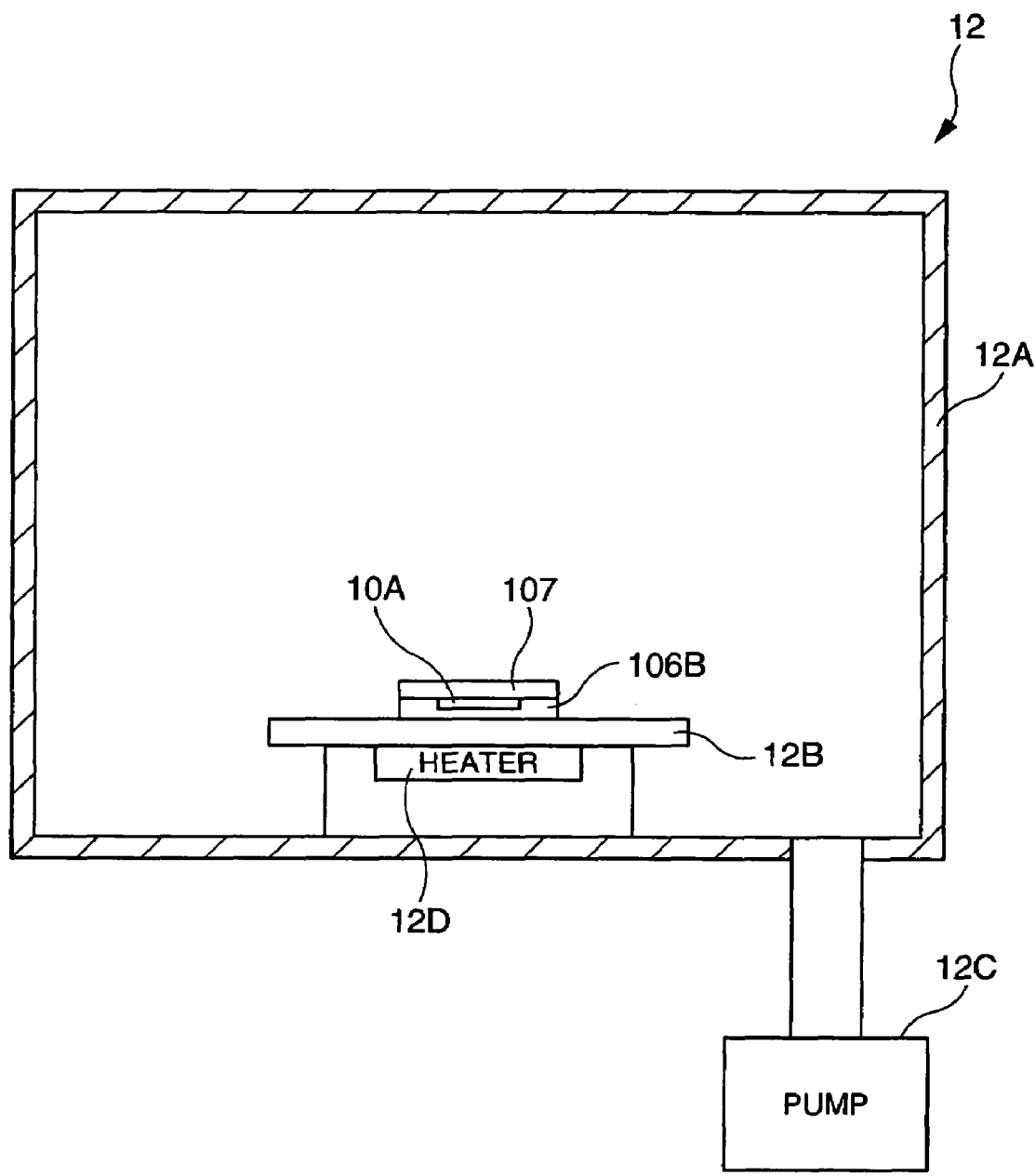
FIG. 9 is a drawing showing a schematic structure of a solvent removal-forming device provided in the film forming device shown in FIG. 1.

FIG. 1 is a drawing showing a schematic structure of a film forming device according to the embodiment of the invention; FIG. 2 is a drawing showing a schematic structure of a droplet deposition device in the film forming device shown in FIG. 1; FIG. 3 is a drawing showing a droplet discharge unit in the droplet deposition device shown in FIG. 2; FIGS. 4A and 4B are drawings showing a droplet discharge head in the droplet discharge unit shown in FIG. 3; FIG. 5 is a block diagram showing a control system of the droplet deposition device shown in FIG. 2; FIGS. 6A and 6B are timing charts describing the operation of the droplet discharge head in the droplet deposition device shown in FIG. 2; FIG. 7 is a drawing showing the status of a substrate on which droplets are deposited by the droplet deposition device shown in FIG. 2; FIG. 8 is a drawing for explaining a mechanism that prevents a spontaneous drying of droplets on the substrate; and FIG. 9 is a drawing showing a schematic structure of a solvent removal-forming device provided in the film forming device shown in FIG. 1.

Overall Structure of Film Forming Device

A film forming device 1, according to the embodiment of the invention, discharges a solution made of a film forming material being dissolved into a solvent (or a dispersion liquid made of a film forming material being dispersed into a dispersion medium), and deposits droplets of the solution (or the dispersion liquid) onto a substrate, followed by a removal of the solvent (or the dispersion medium) from the droplets, thereby forming a film on the substrate. As shown in FIG. 1, the film forming device 1 is provided with a droplet deposition device 11, which deposits, on the substrate: droplets of a first liquid material, in which the film forming material is dissolved into a solvent or dispersed into the dispersion medium; and droplets of a second liquid material that contains the same component as that of the solvent. The film forming device 1 is also provided with a forced solvent remover 12 that removes (causes evaporation of) the solvent or the dispersed medium from the droplets of the first liquid material on the substrate, after depositing the first and the second droplets on the substrate. Hereafter, the droplet deposition device 11 and the forced solvent remover 12 are described in sequence. In the description below, the example, where the solution, made of the film forming material being dissolved into the solvent, is used as the first liquid material, is described. The words 'solvent', 'the first liquid material', and 'dissolve' should be replaced with the words 'dispersion medium', 'dispersion liquid', and 'disperse' in the following description, if the aforementioned dispersion liquid is used as the first liquid material.

Overall Structure of Droplet Deposition Device

The droplet deposition device 11 will now be described based on FIGS. 2 and 8.

As shown in FIG. 2, the droplet deposition device 11 is provided with: a head unit 103 having a plurality of liquid discharge heads 2 which will be described later (refer to FIG. 3); a carriage shifting mechanism 104 (a shifting means) that shifts the head unit 103 in a horizontal direction (hereafter 'direction of the X-axis'); a stage 106 for holding a substrate 10A; a stage shifting mechanism 108 (a shifting means) that shifts the stage 106 in a horizontal direction perpendicular to the direction of the X-axis (hereafter 'direction of the Y-axis); and a controller 112 that controls these operations.

The droplet deposition device 11 has a tank 101A that stores a first liquid material 111A, in which the film forming material is dissolved, in the solvent, and a tank 101B that stores a second liquid material 111B, which includes a liquid with the same component as that of the first liquid material 111A, both of them connected to it. More specifically, the tanks 101A and 101B are connected to the head unit 103 via a tube 110 which serves as a channel for transferring the first liquid material 111A and the second liquid material 111B. The first liquid material 111A, stored in the tank 101A, and the second liquid material 111B, stored in the tank 101B, are transferred (supplied) to each of the liquid discharge heads 2 in the head unit 103, with, for instance, the power of compressed air.

It is desirable that the second liquid material 111B be composed only of the liquid of which the components are the same as that of the first liquid material 111A. This results in a equalization of the partial pressure of gas in the vicinity of droplets of the first liquid material 111A on the substrate, where the gas includes the same component as, or one similar to, that of the solvent, with a higher degree of certainty.

Examples of the film forming material may include: oligophenylene and the derivatives thereof; oligothiophene and the derivatives thereof; precursors of oxides; precursors of alloy catalysts; and biological substances (organism-related substances) such as amino acids, oligopeptide, nucleic acids, hormones, and sugars.

The activity of the carriage shifting mechanism 104 is controlled by the controller 112. The carriage shifting mechanism 104, according to the embodiment, has a function for shifting the head unit 103 along the direction of the Z-axis (vertical direction) and for adjusting the height thereof. The carriage shifting mechanism 104 also has a function to rotate the head unit 103 around the axis parallel to the Z-axis, thereby fine adjusting the angle around the Z-axis of the head unit 103.

The stage 106 has flat surfaces parallel to each other on the directions of both the X-axis and the Y-axis. The stage 106 is configured to fix or to hold the substrate 10A for film formation on its flat surface. The details of the stage 106 will be described later.

The stage shifting mechanism 108 shifts the stage 106 along the Y-axis that is perpendicular to both the X-axis and the Z-axis, and its activity is controlled by the controller 112. The stage shifting mechanism 108 also has, according to the embodiment, a function for rotating the head unit 106 around the axis parallel to the Z-axis, thereby correcting the slope around the Z-axis of the substrate 10A placed on the stage 106, fine-tuning it so that it becomes straight.

As described above, the carriage shifting mechanism 104 shifts the head unit 103 to the direction of the X-axis. At the same time, the stage shifting mechanism 108 shifts the stage 106 to the direction of the Y-axis. Consequently, the carriage shifting mechanism 104 and the stage shifting mechanism 108 allows modification of the relative position between the stage 106 and the head unit 103.

The detailed structure and functions of the controller 112 will be described later.

Head Unit

As shown in FIG. 3, the head unit 103 is configured to have the liquid discharge heads 2, which are inkjet heads, mounted in multiple numbers on a carriage 105. The carriage 105 is indicated in a vertical line (double dashed line) in FIG. 3. Solid lines indicating the discharge heads 2 illustrate the locations of the faces of the nozzles of the discharge heads 2 (each face of the nozzle represents a nozzle plate 128 described later).

The head unit 103 is provided with a first discharge unit and a second discharge unit, where the first discharge unit includes 6 liquid discharge heads 2 that discharge the first liquid material 111A, i.e. a first head 21A, a second head 22A, a third head 23A, a forth head 24A, a fifth head 25A, and a sixth head 26A; and where the second discharge unit includes 6 more liquid discharge heads 2 that discharge the second liquid material 111B, i.e. a first head 21B, a second head 22B, a third head 23B, a forth head 24B, a fifth head 25B, and a sixth head 26B. In total, 12 liquid discharge heads 2 are installed.

As described, the film forming device 1 has the first discharge unit that discharges the first liquid material 111A, and the second discharge unit that discharges the second liquid material 111B.

In the embodiment, since the first and the second discharge units each have inkjet heads, the distance between the droplet of the first liquid material 111A and the droplet for the second liquid material 111B can be relatively easily configured to the desired value by the arrangement of the inkjet heads.

The aforementioned shifting means allows shifting of the inkjet heads of the first discharge unit as well as that of the second discharge unit, relative to the substrate 10A, in the direction parallel to the surface thereof. Consequently, locations and numbers for forming the droplets with the first liquid material 111A and with the second liquid material 111B may be modified appropriately.

Hereafter, these liquid discharge heads 2 described above are collectively called 'the liquid discharge heads 2', and if there is a need to distinguish the individual heads, they will be referred to as 'the first head 21A, the second head 22A, . . . ' and so forth.

Droplet Discharge Head

Multiple nozzles (nozzle holes) 25 are formed on the faces of the nozzles of the liquid discharge heads 2 along the X-axis in even intervals, forming a nozzle line. The number of nozzle lines in one liquid discharge head 2 may be at least one. The number of nozzles 25 formed in one liquid discharge head 2 is, normally between a few dozen and several hundred, but is not limited to that range.

Each of the liquid discharge heads 2 is an inkjet head shown in FIGS. 4A and 4B. More specifically, the droplet discharge head 2 is provided with a vibration plate 126 and a nozzle plate 128. A liquid retention pit 129 is positioned between the vibration plate 126 and the nozzle plate 128. The first liquid material 111A is supplied from the tank 101A via a hole 131, and is constantly filled into the liquid retention pit 129. In FIGS. 4A and 4B, the liquid discharge head 2 for discharging the first liquid material 111A is shown. The structure of the liquid discharge head 2 for discharging the second liquid material 111B is one similar to the one shown in FIGS. 4A and 4B.

A plurality of isolation walls 122 is also positioned between the vibration plate 126 and the nozzle plate 128. A part surrounded by the vibration plate 126, the nozzle plate 128, and a pair of isolation walls 122 is called a cavity 120. Since one cavity 120 is installed per every nozzle 25, the number of cavities 120 and nozzles 25 is identical. The first liquid material 111A is supplied to the cavity 120 from the liquid retention pit 129 via a supply mouth 130 positioned between a pair of isolation walls 122.

An oscillator 124 which functions as a driving element that changes the pressure of the first liquid material 111A filled-in to the cavity 120 is positioned per every cavity 120. The oscillator 124 includes a piezo element 124C and a pair of electrodes 124A and 124B that sandwich the piezo element 124C. The first liquid material 111A is discharged from the corresponding nozzles 25 by applying a drive voltage between the pair of electrodes 124A and 124B. Here, the shape of the nozzles 25 is adjusted so that the first liquid material 111A is discharged to the direction of the Z-axis from the nozzles 25.

This oscillator 124 is driven corresponding to a signal from the controller 112 (refer to FIG. 2) described later.

The liquid discharge head 2 may also utilize, besides the piezo electric actuator shown in FIG. 2, a capacitive actuator or an electric thermal transducer that discharges liquid by thermal expansion of the liquid material 111A.

Controller

A configuration of the controller 112 will now be described.

As shown in FIG. 5, the controller 112 is provided with an input buffer memory 200, a storage device 202, a processing unit 204, a scanning drive unit 206, a head drive unit 208, a carriage location detector 302, and a stage location detector 303.

The buffer memory 200 and the processing unit 204 are interconnected so as to be able to communicate with each other. The processing unit 204 is interconnects with the storage device 202 so as to be able to communicate with it. The processing unit 204 is also interconnected with the scanning drive unit 206, and with the head drive unit 208, so it can communicate with each of them. Moreover, the scanning drive unit 206 is also interconnected with the carriage shifting mechanism 104, and with the stage shifting mechanism 108, so it can communicate with each of them. Similarly, the head drive unit 208 interconnects with each of the plurality of the liquid discharge heads 2, so that it can communicate with each of them.

The input buffer memory 200 receives the location data of where to discharge the first liquid material 111A and the second liquid material 111B, or in other words, draw-pattern data from an external information processing device. The input buffer memory 200 supplies this draw-pattern data to the processing unit 204, and it, in turn, the processing unit 204 stores the draw-pattern data to the storage device 202. The storage device 202 is configured with a RAM, a magnetic recording medium, a magnet optical recording medium, etc.

Hence, this controller 112 controls the drive of the liquid discharge heads 2 based on the driving information stored in the storage device 202. This allows the droplets for the first liquid material 111A and the second liquid material 111B to be formed at the desired locations on the substrate 10A.

The carriage location detector 302 detects the location of the carriage 105, or the shifting distance of the head unit 103 in the direction of the X-axis, and inputs the detected signal to the processing unit 204.

The stage location detector 303 detects the location of the stage 106, or the shifting distance of the substrate 10A in the direction of the Y-axis, and inputs the detected signal to the processing unit 204.

The carriage location detector 302 and the stage location detector 303 are composed with items such as a linear encoder, or a laser end-measuring machine.

The processing unit 204 controls the activities of the carriage shifting mechanism 104 and the stage shifting mechanism 108 (a closed loop control), based on the detected signals from the carriage location detector 302 and the stage location detector 303 via the scanning drive unit 206, thereby controlling the locations of the head unit 103 and of the substrate 10A.

The processing unit 204 also controls the shifting speed of the stage 106, or in other words, of the substrate 10A, by controlling the activity of the stage shifting mechanism 108.

Moreover, the processing unit 204 provides a switching signal SC that specifies the on-off status of the nozzles 25, once per discharge timing, to the head drive unit 208, based on the draw-pattern data. The head drive unit 208 provides at least one discharge signal ES, necessary for the discharge of the first liquid material 111A and of the second liquid material 111B, based on the switching signal SC. As a result, the first liquid material 111A and the second liquid material 111B are discharged as droplets from the nozzles 25 of the liquid discharge heads 2.

The controller 112 may also be a computer that contains a CPU, a ROM, and a RAM. In this case, the above features of the controller 112 are achieved by a software program run by the computer. The controller 112 may also be a dedicated circuit (hardware).

The configuration and the function of the head drive unit 208 in the controller 112 will now be described.

As shown in FIG. 6A, the head drive unit 208 has one drive signal generation unit 203 and a plurality of analog switches AS. As shown in FIG. 6B, the drive signal generation unit 203 generates a drive signal DS. The electric potential of the drive signal DS deviates from the reference potential L with time. More specifically, the drive signal DS includes a plurality of discharging waves P, repeated in a discharge cycle EP. Discharging one droplet from the nozzle 25 requires the discharging wave P to correspond to the waveform of the drive voltage that needs to be applied between the pair of electrodes in the corresponding oscillator 124.

The drive signal DS is supplied to each of the input terminals of the analog switches AS. Each of the analog switches AS is installed corresponding to each of the nozzles 25. In other words, there is the same number of analog switches AS and nozzles 25.

The processing unit 204 provides the switching signals SC that specifies the on-off status of the nozzles 25 to each of the analog switches AS. Here, each of the switching signals SC has either a high level or a low level state, independently for each of the analog switches AS. The analog switches AS supply discharge signals ES to the electrode 124A of the oscillator 124, corresponding to the drive signal DS and the switching signals SC. More specifically, if one of the switching signal SC is at a high level, the analog switches AS transmit the drive signal DS to the electrode 124A as the discharge signal ES. On the other hand, if the switching signal SC is at a low level, the electric potential of the discharge signal ES that the analog switches AS output is at the reference potential L. If the drive signal DS is provided to the electrode 124A of the oscillator 124, the first liquid material 111A or the second liquid material 111B is discharged from the nozzle 25, corresponding to the oscillator 124. Here, the reference potential L is applied to the electrode 124B of each oscillator 124.

In the example shown in FIG. 6B, each of the two switching signals SC have the high level period and the low level period, in a way that the discharging wave P emerges in 2 EP cycles, which is twice as long as the discharge cycle EP, for each of the two discharge signals ES. Consequently, the first liquid material 111A and the second liquid material 111B are discharged from the two corresponding nozzles 25 in a cycle of 2EP. A common drive signal DS from the common drive signal generation unit 203 is provided to each oscillator 124 that corresponds to the two nozzles 25. Hence, the first liquid material 111A or the second liquid material 111B is discharged from the two nozzles 25 in approximately the same timing.

This droplet deposition device 11 operates so as to deposit (land) the first liquid material 111A and the second liquid material 111B on the substrate 10A, by discharging them from the nozzles 25 of each of the liquid discharge heads 2 in the head unit 103, while shifting the substrate 10A held on the stage 106 to the direction of the Y-axis, and passing it below the head unit 103, utilizing the activity of the stage shifting mechanism 108. Hereafter, this operation may be called 'main scanning of the head unit 103 and the substrate 10A'.

The length of the head unit 103 in the direction of X-axis, which the head unit 103 can reach, at once, by discharging the first liquid material 111A and the second liquid material 111B to the substrate 10A, is called an entire discharge width W. If the width of the substrate 10A is shorter than the width of the entire discharge width W, the entire surface of the substrate 10A is deposited with those liquid materials, by performing the main scanning of the head unit 103 and the substrate 10A once.

On the other hand, if the entire discharge width W is shorter than the width of the substrate 10A in the direction of X-axis, then the entire surface of the substrate 10A is deposited with the first liquid material 111A and the second liquid material 111B, by performing two movements alternatively and repeatedly. The two movements include the main scanning of the head unit 103 and the substrate 10A, and a sub scanning, where the carriage shifting mechanism 104 operates to shift the head unit 103 to the direction of the X-axis.

As shown in FIG. 7, the droplet deposition device 11 according to the embodiment, deposits the droplets of the first liquid material 111A and of the second liquid material 111B on the substrate 10A, so as to arrange the droplets of the second liquid material 111B to the locations where the droplets of the first liquid material 111A are not formed. More specifically, the droplet deposition device 11 discharges the first liquid material 111A on the first parts on the substrate 10A, and deposits the droplets thereof with the following six heads: the first head 21A, the second head 22A, the third head 23A, the forth head 24A, the fifth head 25A, and the sixth head 26A. It also discharges the second liquid material 111B on the second parts on the substrate 10A, which are separate from the first parts (preferably, in the vicinity of the first parts), and deposits the droplets thereof, which have the same component as, or one similar to, that of the solvent (hereafter, may also be simply referred to as 'the same component') utilizing the following six heads: the first head 21B, the second head 22B, the third head 23B, the forth head 24B, the fifth head 25B, and the sixth head 26B.

According to this embodiment, as shown in FIG. 7, there are multiple first parts, and the second parts are located in between those first parts. This results in an equalization of the partial pressure of gas in the vicinity of droplets of the first liquid material 111A on the substrate 10A, among the droplets of the first liquid material 111A, where the gas includes the same component as, or one similar to, that of the solvent.

As described, the controller 112 controls the quantity and/or the location of the droplets discharged from the droplet discharge heads 2. This allows the droplets for the first liquid material 111A and the second liquid material 111B to be formed at the desired locations on the substrate 10A, while preventing any contact between them.

The stage 106 that holds the substrate 10A will now be described in detail with reference to FIG. 8.

The stage 106 has a body 106A, and a supporting material 106B that supports the substrate 10A and which can be installed and is detachable from the body 106A. After the droplets of the first liquid material 111A and of the second liquid material 111B are deposited on the substrate 10A, a cover 107 may be attached to the supporting material 106B, in order to maintain the gas of the vicinity of the droplets on the substrate 10A. This allows a prevention of a spontaneous drying of droplets on the substrate 10A.

The cover 107 is provided with a pitted part 107A that projects away from the supporting material 106B, so that when attached thereto, the cover 107 faces to the substrate 10A on the supporting material 106B. This allows a prevention of contact between the cover 107 and the substrate 10A.

Moreover, at least one relatively fine through-hole 107B that penetrates the aforementioned pitted part 107A to the side surface is formed on the cover 107. This allows a removal of the solvent from the droplets of the first liquid material 111A on the substrate 10A, as well as an evaporation of the droplets of the second liquid material 111B on the substrate 10A, by putting the substrate 10A under a low pressure with the forced solvent remover 12 (described in detail later), even when the cover 107 is attached to the supporting material 106B.

This arrangement of fixing the cover 107 to the supporting material 106B is done by, but is not limited to, using a turning peg, as done in this embodiment.

It is desirable that, depending on the variations of solvents used, this cover 107 be installed on the supporting material 106B as soon as possible after depositing the droplets of the first liquid material 111A and the second liquid material 111B, in order to prevent a spontaneous drying of droplets on the substrate 10A, although some solvents do not require this installation.

The supporting material 106B is removed from the body 106A, and the substrate 10A is carried manually to the forced solvent remover 12 (described in detail later), in a state where the spontaneous drying of droplets on the substrate 10A is prevented.

As described, the droplets are deposited stably on the substrate 10A while it is held to the stage 106.

This allows an easy carriage of the substrate 10A away from the stage 106, to a different location (in this embodiment, to the forced solvent remover 12 described later), after the deposition of the droplets thereon.

Here, the cover 107 is installed on the supporting material 106B in order to maintain and keep the gas of the vicinity of the droplets on the substrate 10A.

The substrate 10A may also be carried to the forced solvent remover 12 with the supporting material 106B attached to the body 106A, if the system is configured so that it is able to carry the stage 106 to the forced solvent remover 12.

The droplet deposition device 11 described above, discharges the first liquid material 111A on the first parts on the substrate 10A, and deposits the droplets thereof with the first discharge unit that includes the first head 21A, the second head 22A, and the like. It also discharges the second liquid material 111B on the second parts on the substrate 10A, which are in the vicinity of the first parts, and deposits the droplets thereof with the second discharge unit that includes the first head 21B, the second head 22B, and the like.

Thereafter, as the droplets of the second liquid material 111B evaporate, the solvent is removed from the droplets of the first liquid material 111A deposited on the substrate 10A. This allows a control of speed in removing the solvent from the droplets of the first liquid material 111A on the substrate 10A, and a formation of a small number of crystal cores (desirably one) in each droplet. Thereafter, by rapidly removing the solvent from those droplets, the crystal cores grow and the crystalline film is formed on the substrate 10A with the forced solvent remover 12 described later. Here, the space above the stage 106 constitutes a first removal unit, in which the solvent is removed from the droplets of the first liquid material 111A on the substrate 10A, while the speed in removing the solvent from the first liquid material 111A on the substrate 10A being controlled as described above.

Particularly, according to this embodiment of the invention, by appropriately depositing, on the substrate 10A, the second liquid material 111B that includes the same component as, or one similar to, that of the solvent, the equalization of the partial pressure of gas in the vicinity of the droplets of the first liquid material 111A on the substrate 10A, where the gas includes the same component as, or one similar to, that of the solvent, is achieved. As a result, the unnecessary shift of droplets of the first liquid material 111A on the substrate 10A is prevented, and the crystalline film is formed at the desired location on the substrate 10A.

It is desirable that the first discharge unit (the first head 21A, the second head 22A, and the like) be configured to deposit the droplets of the first liquid material 111A on the substrate 10A, after the second discharge unit (the first head 21B, the second head 22B, and the like) deposit the droplets of the second liquid material 111B on the substrate 10A. With this configuration, the gas, with the same component as, or one similar to, that of the solvent, is formed in advance, and thereafter the droplets of the first liquid material 111A are deposited on the substrate 10A. Hence the time it takes to remove the solvent from the droplets of the first liquid material 111A on the substrate 10A is controlled with a higher degree of certainty.

Structure of Forced Solvent Remover

The forced solvent remover 12 has, as shown in FIG. 9, a housing 12A, a stage 12B that holds the substrate 10A inside the housing 12A, a pump 12C (a pressure reducer) that reduces the pressure inside the housing 12A, and a heater 12D installed on the stage 12B.

The internal space of the housing 12A is sealed.

The stage 12B is installed inside this housing 12A, in order to hold the substrate 10A, on which the aforementioned droplet deposition device 11 deposit the droplets. In this embodiment, the stage 12B has a similar configuration to that of the body 106A of the stage 106, and the substrate 10A is held on the stage 12B, where it is present between the supporting material 106B and the cover 107.

The pump 12C is connected to the bottom of the housing 12A, and reduces the pressure inside the housing 12A after the substrate 10A is held on the stage 12B.

The heater 12D is installed beneath the stage 12B, and heats the substrate 10A after it is held on the stage 12B.

In this embodiment, the pump 12C and the heater 12D are both installed in the forced solvent remover 12. However, in some solvents, only one of them may be required. Moreover, the heating and the pressure reduction of the substrate 10A in the forced solvent remover 12 may also be conducted without the cover 107 (detached from the supporting material 106B).

This forced solvent remover 12 can remove the solvent from the droplets of the first liquid material 111A on the substrate 10A more rapidly, so that the crystal growth can be produced proactively from the small numbered of cores (preferably one) formed inside each droplet of the first liquid material 111A. Consequently, a single crystal film may be formed on the substrate 10A. The forced solvent remover 12, particularly the internal space of the housing 12A, constitutes a second removal unit, in which the solvent is removed, as described, from the droplets of the first liquid material 111A on the substrate 10A more rapidly. This means that the film forming device 1, according to this embodiment, has the aforementioned first and the second removal units for removing the solvent from the droplets of the first liquid material 111A on the substrate 10A, while also removing the liquid, which is made of the same component as, or one similar to, that of the solvent from the droplets of the second liquid material 111B thereon.

By utilizing the heater 12D and the pump 12C, the forced solvent remover 12 can, with its relatively simple device structure, make the crystal core grow within each of the droplets of the first liquid material 111A on the substrate 10A, with a higher degree of certainty.

The droplet discharge heads 2 are installed outside the housing 12A, i.e., outside the reduced pressure area. Therefore, there is no leaking of the first liquid material 111A and the second liquid material 111B from the droplet discharge heads 2, since they are not exposed to the reduced pressure. At the same time, with this configuration, the device structure may also be simplified.

Consequently, the above-described film forming device 1 can form the crystalline film on the substrate 10A.

Forming the crystalline film on the substrate 10A requires: bringing the droplets of the first liquid material 111A arranged on the substrate 10A to supersaturation; and controlling (maintaining) the partial pressure of the gas to be a first partial pressure in which the solvent does not evaporate easily from the droplets of the first liquid material 111A; thereby forming a crystal core in each droplet of the first liquid material 111A. The first partial pressure may be, for instance, approximately the same, or identical to, the saturation vapor pressure. Forming the crystalline film on the substrate 10A also requires bringing the partial pressure of the gas down to a second partial pressure, in which the crystal growth of this crystal core occurs in a higher priority than the additional generation of crystal cores. The second partial pressure is, for instance, $1/10$ through $1/100$ of the saturation vapor pressure. Here, the aforementioned gas is in the vicinity of the droplets of the first liquid material 111A, and includes the same component as that of the solvent thereof.

In the film forming device 1 according to the embodiment of the invention, droplets of the first liquid material 111A and of the second liquid material 111B are first formed on the substrate 10A with the droplet deposition device 11. As a result, the droplets of the first liquid material 111A, immediately after they being arranged on the substrate 10A, become supersaturated, and the crystal core necessary for crystallization is generated inside each droplet of the first liquid material 111A, while setting the partial pressure of the gas to the first partial pressure, which is high enough so that the solvent does not evaporate easily from the droplets of the first liquid material 111A. Here, this gas is in the vicinity of the droplets of the first liquid material 111A, and includes the same component as that of the solvent thereof. Thereafter, the crystal growth is started by the forced solvent remover 12 reducing the partial voltage of the gas, from the first partial voltage down to the second partial voltage. Here, this gas is in the vicinity of the droplets of the first liquid material 111A, including the same component as that of the solvent thereof. The first partial voltage is high enough so that the solvent does not evaporate easily from the droplets of the first liquid material 111A. The second partial voltage is low enough so that the crystal growth of the already-emerged crystal core occurs in a higher priority than the additional generation of crystal cores.

Consequently, the crystalline film arranged in a pattern is easily formed on the substrate.

In the case where the volume of the droplets of the first liquid material 111A deposited on the substrate 10A by the first discharge unit (in other words, the first through sixth heads 21A to 26A) is very small, smaller, for instance, than, or equal to 20 picoliter, the solvent tends to evaporate from the droplets, if the partial pressure of the gas in the vicinity of the droplets of the first liquid material 111A, the gas having the same component as the solvent thereof, is low. Thus, the concentration of the film forming material increases rapidly inside the droplets of the first liquid material 111A, and its level of supersaturation increases sharply, resulting in a multiple formation of crystal cores and disintegration of the film forming material.

Taking the above into consideration, the film forming device 1 according to the embodiment in the invention, incorporates the second discharge unit (in other words, the first through sixth heads 21B to 26B that discharge the second liquid material 111B), thereby depositing the droplets of the second liquid material 111B (the same component as that of the solvent), in the vicinity of the first liquid material 111A. As a result, the partial pressure of the gas, immediately after the deposition of the droplets of the first liquid material 111A, the gas being in the vicinity of those droplets and including the same component as that of the solvent, is kept at (maintained) the-first partial pressure (in other words, the partial pressure is high enough for the solvent not to evaporate easily from the droplets of the first liquid material 111A). Consequently, the droplets of the first liquid material 111A are stabilized in a relatively low level of supersaturation (in other words, the speed of increase of supersaturation of the droplets of the first liquid material 111A decreases), resulting in the formation of a small number (ideally one) of cores per droplet.

Moreover, in order to form a single crystal film, it is necessary that only a single core, after being generated inside the droplet of the first liquid material 111A, undergo crystal growth, and that no other core formation will occur. However, if the partial pressure of the gas, immediately after the deposition of the droplets of the first liquid material 111A, the gas being in the vicinity of those droplets, and including the same component as that of the solvent, remains high, the additional core may be formed in some variation of solvents.

Taking the above into consideration, in the system of the film forming device 1 in the invention, the forced solvent remover 12 reduces the pressure of the gas, down to the low partial pressure (the second partial pressure), in which the crystal growth of the crystal core, already generated in the droplet, occurs in a higher priority than the additional generation of crystal cores. Here the gas has the same component as that of the solvent evaporated in the vicinity of the droplets of the first liquid material 111A on the substrate 10A. Specifically, the first partial pressure, which is, for instance, approximately the same, or identical to the saturation vapor pressure, is reduced to the second partial pressure measuring 1.3 Pa ($10^{-2}$ torr), immediately after the generation of a small number of crystal cores (ideally one) inside each droplet of the first liquid material 111A, within 1 to 10 (inclusive) seconds. Hence, the level of supersaturation of the droplets of the first liquid material 111A is rapidly increased. Consequently, the crystal growth is encouraged while preventing the additional core generation inside each droplet of the first liquid material 111A, thereby allowing to obtain the single crystal crystalline film.

Particularly, according to this embodiment of the invention, by depositing the second liquid material 111B on the substrate 10A, the gas, having the same component as, or one similar to, that of the solvent, is proactively formed in the vicinity of the droplets of the first liquid material 111A. As a result, the droplets of the first liquid material 111A on the deposition substrate 10A do not shift, allowing the formation of the crystalline film at the prescribed location on the substrate. Moreover, the partial pressure of the gas in the vicinity of the droplets, immediately after the deposition, evens out at a high value, the partial pressure of the gas, having the same component as that of the solvent immediately after the deposition of the droplets of the first liquid material 111A, increases so that the solvent does not evaporate easily from the droplets, and thereby allowing a small number of crystal cores to form.

The film forming device 1 according to the embodiment of the invention forms the gas of the first partial pressure as described above, by forming the droplets of the second liquid material 111B in the vicinity of the first liquid material 111A. However, this gas formed by the first partial pressure may also be formed by the adjustments of the discharge intervals between the droplets of the first liquid material 111A, and by the discharge volume of the first liquid material 111A.

As described, the film forming device 1, according to the embodiment, rapidly transforms the first partial pressure into the second partial pressure, by heating the substrate 10A, on which the droplets are deposited, and reducing the gas pressure, utilizing the forced solvent remover 12. However, the rapid transformation of the first partial pressure into the second partial pressure is also possible, by altering the gas in the vicinity of the droplets of the first liquid material 111A with an inert gas.

It is desirable that the solution for the first liquid material 111A includes any one of the following: a solution that contains enough amount of film forming material so that it becomes saturated upon discharge; a solution that contains the film forming material in a volume which, upon discharge, the concentration level thereof, is equal to or higher than one-tenth of the saturation concentration, and lower than the saturation concentration level; and a solution that contains enough amount of film forming material so that it becomes supersaturated upon discharge. This makes the droplets of the first liquid material 111A, arranged on the substrate 10A, more likely to become supersaturated immediately after the discharge. Hence the crystal core is formed in each droplet with a higher degree of certainty.

EXAMPLES

Examples of the present invention will now be described.

Example 1

The droplets of a solution, where the film forming material was dissolved into the solvent, and the droplets are made of the same component as that of the solvent, were deposited on the silicon substrate, using the droplet deposition device shown in FIG. 2, in a temperature of 25 degrees Celsius.

Here, quinolinol aluminum complex ($Alq_3$) was used for film forming material, dissolved at 0.1% concentration by weight, into the solvent 2,3-dihydrobenzofuran. The saturation of $Alq_3$ in 2,3-dihydrobenzofuran takes place, in a 1.0% concentration by weight in 25 degrees Celsius. Therefore, the concentration of the $Alq_3$ in this solvent was one-tenth of the saturation concentration.

The droplets of the solvent were deposited in a reticular pattern of 3 columns by 10 rows, in a 210 µm pitch, as shown in FIG. 7, and the droplets with the same component as that of the solvent were deposited in between. Here, the volumes of both types of the droplets were 20 picoliter each.

Upon the completion of the droplets formation, the substrate was simultaneously carried into the housing of the forced solvent remover shown in FIG. 9. In this case, the gas in the vicinity of the droplets on the substrate was retained by using the cover shown in FIG. 8.

Thereafter, the operation of the pump was started and the pressure within the housing was reduced to 1.3 Pa ($10^{-2}$ torr). This state was kept for 6 hours. Here, the temperature inside the housing was 40 degrees Celsius.

The acicula $Alq_3$ film that is 30 µm long and 0.1 µm thick was formed in an approximately-single crystal state, at each location where the droplets of the solvent were formed, on the silicon substrate that was taken out from the housing 6 hours later.

Example 2

For film forming material, 4-amino-p-terphenyl was used, dissolved at a 1.0% concentration by weight, into the solvent dimethylformamide. The rest of the conditions were the same as that of Example 1 in this film formation on the silicon substrate.

The saturation of 4-amino-p-terphenyl in dimethylformamide takes place in a 1.0% concentration by weight in 25 degrees Celsius (the temperature is of the time of the solution discharge). Therefore, this solvent was in a state of saturation concentration with 4-amino-p-terphenyl.

The rectangular (20 μm by 30 μm) 4-amino-p-terphenyl film that is 50 μm thick was formed, at each location where the droplets were formed in an approximately-single crystal state, on the substrate after the film formation.

Example 3

As a film forming material, 2,2':5',2"-terthiophene-5,5"-dicarboxaldehyde (a derivative of terthiophene) is used, dissolved at a 1.0% concentration by weight, into the solvent dimethylformamide. The rest of the conditions were the same as in Example 1 in this deposition to the silicon substrate.

The saturation of 2,2':5',2"-terthiophene-5,5"-dicarboxaldehyde in dimethylformamide takes place in a 1.0% concentration by weight in 25 degrees Celsius (the temperature is of the time of the solution discharge). Therefore, this solvent was in a state of saturation concentration with 2,2':5',2"-terthiophene-5,5"-dicarboxaldehyde.

The rectangular (20 μm by 30 μm) 2,2':5',2"-terthiophene-5,5"-dicarboxaldehyde film that is 50 μm thick was formed, at each location where the droplets were formed in an approximately-single crystal state, on the substrate after the film formation.

The crystalline films formed with the film forming device, according to the embodiment of the invention, are suitably used as semiconductor films for: various electronic devices, such as transistors, diodes, capacitors, and luminescent layers or hole injection/transfer layers in organic electroluminescence (hereafter 'organic EL') devices.

The crystalline thin films formed with the film forming device, according to the embodiment of the invention, are suitably used as semiconductor films for: various electronic devices, such as transistors, diodes, capacitors, and luminescent layers or hole injection/transfer layers in organic EL devices. Display devices provided with electronic devices, in which thin film deposition was performed with the film forming device according to the embodiment of the invention, include liquid crystal display devices, organic EL display devices, and the like.

What is claimed is:

1. A film forming device comprising:
   a first discharge unit for discharging a first liquid material, in which a film forming material is dissolved in a solvent or dispersed in a dispersion medium, the first liquid material, discharged by the first discharge unit, containing the film forming material in a volume of which a concentration level is equal to or higher than one-tenth of a saturation concentration of the film forming material;
   a second discharge unit for discharging a second liquid material containing a liquid with the same component as the solvent or the dispersion medium; and
   a removal unit for removing the solvent or the dispersion medium from droplets of the first liquid material arranged on a substrate by the first discharge unit, while removing the liquid, arranged on the substrate by the second discharge unit, from droplets of the second liquid material,
   a crystalline film being formed on the substrate, by arranging the droplets of the first liquid material on first parts on the substrate by the first discharge unit, while arranging the droplets of the second liquid material on second parts on the substrate, which are separated from the first parts, by the second discharge unit, thereafter by removing the solvent from the droplets of the first liquid material arranged on the first parts, using the removal unit for solvent removing.

2. The film forming device according to claim 1, the second parts being in the vicinity of the first parts.

3. The film forming device according to claim 1, the second liquid material being composed only from a liquid containing the same component as the solvent or the dispersion medium.

4. The film forming device according to claim 1, the first and the second discharge units each having inkjet heads.

5. The film forming device according to claim 4, the inkjet heads of the first discharge unit and the inkjet heads of the second discharge unit being allowed to shift relative to the substrate in the direction parallel to the surface thereof.

6. The film forming device according to claim 1, the first discharge unit being configured to arrange the droplets of the first liquid material on the first parts, after the droplets of the second liquid material are arranged on the second parts by the second discharge unit.

7. The film forming device according to claim 1, further comprising a controller for controlling a drive of the first and the second discharge units, based on drive information of the first discharge unit.

8. The film forming device according to claim 7, the controller controlling quantities and/or locations of the first liquid material discharged from the first discharge unit, and of the second liquid material discharged from the second discharge unit.

9. The film forming device according to claim 1, further comprising a stage for holding the substrate, where the first and the second discharge units are each driven in a state in which the substrate is held to the stage.

10. The film forming device according to claim 9, the stage including a body and a supporting material that are installed detachable to the body and supports the substrate.

11. The film forming device according to claim 10, there being an option to install a cover on the supporting material in order to maintain a gas in the vicinity of the droplets of the first and the second liquid materials on the substrate that is supported by the supporting material.

12. The film forming device according to claim 11, orifices of the first and the second discharge units being installed outside the reduced pressure area.

13. A method of film forming, comprising:
   a process for arranging, on first parts on a substrate, by a first discharge unit, droplets of a first liquid material, in which a film forming material is dissolved in a solvent or dispersed in a dispersion medium, the first liquid material, discharged by the first discharge unit, containing the film forming material in a volume of which a concentration level is equal to or higher than one-tenth of a saturation concentration of the film forming material;
   a process for arranging, by a second discharge unit, droplets of a second liquid material containing a liquid with the same component as the solvent or the dispersion medium, on second parts on a substrate, which are separated from the first parts; and
   a process for removing, in a removal unit, the solvent or the dispersion medium from droplets of the first liquid material arranged on the substrate by the first discharge unit, while removing the liquid from droplets of the second liquid material arranged on the substrate by the second discharge unit, thereby forming a crystalline film on the substrate.

14. The method of film forming, according to claim 13, the second parts being in the vicinity of the first parts.

15. The method of film forming, according to claim 13, the second liquid material being composed only from a liquid, containing the same component as the solvent or the dispersion medium.

16. The method of film forming, according to claim 13, including a plurality of first parts, and the second parts being located in between the first parts.

17. A method for manufacturing an electronic apparatus including forming a film according to the method of claim 13.

18. The method for manufacturing an electronic apparatus, according to claim 17, the electronic apparatus being an organic electroluminescence device.

* * * * *